United States Patent
Rahn et al.

(10) Patent No.: US 6,613,642 B2
(45) Date of Patent: Sep. 2, 2003

(54) METHOD FOR SURFACE ROUGHNESS ENHANCEMENT IN SEMICONDUCTOR CAPACITOR MANUFACTURING

(75) Inventors: Stephen Rahn, Fishkill, NY (US); Irene McStay, Hopewell Jct, NY (US); Helmut Horst Tews, Poughkeepsie, NY (US); Uwe Schroeder, Fishkill, NY (US); Stephan Kudelka, Fishkill, NY (US); Rajarao Jammy, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/016,075

(22) Filed: Dec. 13, 2001

(65) Prior Publication Data

US 2003/0114005 A1 Jun. 19, 2003

(51) Int. Cl.[7] .............................................. H01L 21/20
(52) U.S. Cl. ........................ 438/398; 438/689; 438/757
(58) Field of Search ................................ 257/301–309; 438/239, 240, 243–249, 253–256, 386–392, 396, 398, 689, 706, 733, 745, 756, 757

(56) References Cited

U.S. PATENT DOCUMENTS

| | | |
|---|---|---|
| 5,405,801 A | 4/1995 | Han et al. |
| 5,508,542 A | 4/1996 | Geiss et al. |
| 5,804,034 A | 9/1998 | Kaeriyama |
| 5,877,061 A | 3/1999 | Halle et al. |
| 6,025,225 A | 2/2000 | Forbes et al. |
| 6,025,245 A | 2/2000 | Wei |
| 6,033,967 A | 3/2000 | Li et al. |
| 6,083,787 A | 7/2000 | Lee |
| 6,204,141 B1 | 3/2001 | Lou |
| 6,448,131 B1 * | 9/2002 | Cabral, Jr. et al. .......... 438/243 |

* cited by examiner

*Primary Examiner*—Kamand Cuneo
*Assistant Examiner*—Asok Kumar Sarkar
(74) *Attorney, Agent, or Firm*—Ira D. Blecker; Cantor Colburn LLP

(57) ABSTRACT

A method for increasing the surface area of an original surface in a semiconductor device is disclosed. In an exemplary embodiment of the invention, the method includes forming a layered mask upon the original surface, the layered mask including a masking layer thereatop having a varying thickness. An isotropic etch is then applied to the layered mask, which isotropic etch further removes exposed portions of the original surface as the layered mask is removed. Thereby, the isotropic etch enhances the non-uniformity of the masking layer and creates a non-uniformity in planarity of the original surface.

18 Claims, 5 Drawing Sheets

METHOD FOR SURFACE ROUGHNESS ENHANCEMENT IN SEMICONDUCTOR CAPACITOR MANUFACTURING

BACKGROUND

The present invention relates generally to semiconductor device processing and, more particularly, to methods of enhancing the surface of devices, such as capacitors, used in computer memory systems.

Modern dynamic random access memories (DRAMs) commonly use a single capacitor as a data storage element. As the packing density of DRAMs continues to increase over time, the size of the individual transistors and capacitors within an individual memory cell have correspondingly decreased. However, as the dimensions of the capacitors decrease, so too will the capacitance values associated therewith if no additional measures are taken.

In order for a DRAM memory cell to operate reliably, the capacitor therein should have a relatively large capacitance value so that the capacitor is less likely to be affected by noise or by the parasitic capacity of the metal lines and wires. Accordingly, a capacitor having an increased surface area is commonly used to maintain a sufficient capacitance value. Nevertheless, even with the use of deep trench capacitors or stacked capacitors, the available device cell area continues to shrink and, as a result, the capacitance value is difficult to maintain.

Given a limited amount of lateral width and vertical depth or height available for capacitors, another existing approach to maintaining the necessary capacitance values has been to increase the surface area of the capacitor without increasing the lateral or vertical dimensions of the capacitor itself. For example, hemispherical grains (HSG) of silicon may be attached to the surfaces of the capacitor. However, while this process may result in increased surface area and hence increased capacitance, it typically requires specialized tools for the implementation thereof. Furthermore, there is an inherent risk of capacitor leakage associated with this process, due to the use of non-crystalline silicon.

BRIEF SUMMARY

The foregoing discussed drawbacks and deficiencies of the prior art are overcome or alleviated by a method for increasing the surface area of an original surface in a semiconductor device. In an exemplary embodiment of the invention, the method includes forming a layered mask upon the original surface, the layered mask including a masking layer thereatop having a varying thickness. An isotropic etch is then applied to the layered mask, which isotropic etch further removes exposed portions of the original surface as the layered mask is removed. Thereby, the isotropic etch creates a non-uniformity in planarity of the original surface.

In a preferred embodiment, the method further includes forming a silicon layer upon the original surface, and then forming the masking layer upon the silicon layer. The silicon layer and the masking layer are included within the layered mask. The isotropic etch is then applied to both the masking layer and the silicon layer, with the isotropic etch enhancing the varying thickness and further removing the exposed portions of the original surface as the silicon layer is removed. The silicon layer is etched at a faster rate than the masking layer, which masking layer further comprises a nitride layer.

BRIEF DESCRIPTION OF THE DRAWINGS

Referring to the exemplary drawings wherein like elements are numbered alike in the several Figures.

DETAILED DESCRIPTION

Figure 1A:
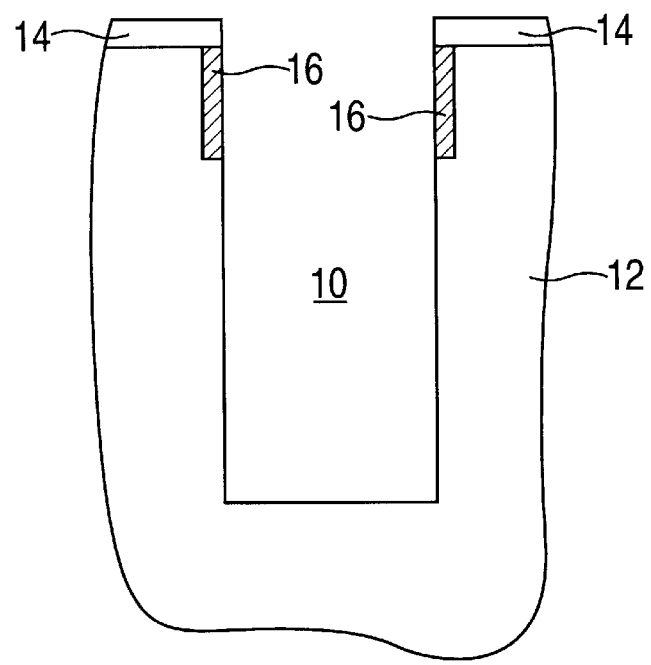
FIGS. 1(a)–1(f) are cross-sectional views which illustrate the processing steps of a method for increasing the surface area of a semiconductor device, such as a deep trench capacitor, in accordance with an embodiment of the invention.

Referring initially to FIGS. 1(a)–1(f), there is illustrated the processing steps of a method for increasing the surface area of an original surface in semiconductor device, such as a deep trench capacitor, in accordance with an embodiment of the invention. It is to be understood that although the following surface enhancement method embodiments are described in their application to a deep trench capacitor, this is by way of example only, and the method embodiments may also be equally applied to other structures which may rise above the surface of a semiconductor wafer. In FIG. 1(a), a trench 10 is initially formed within a silicon substrate 12 which may include a pad dielectric 14 (e.g., nitride) thereatop. An insulator collar 16 may also be located at the top of the trench 10 in order to prevent the outward leakage of charge stored within the capacitor. It should be noted that the depth of the trench 10 is significantly greater than the diameter (or width) thereof. Thus, the trench 10 as shown in the Figures is illustrative only and not depicted to scale.

Figure 1B:
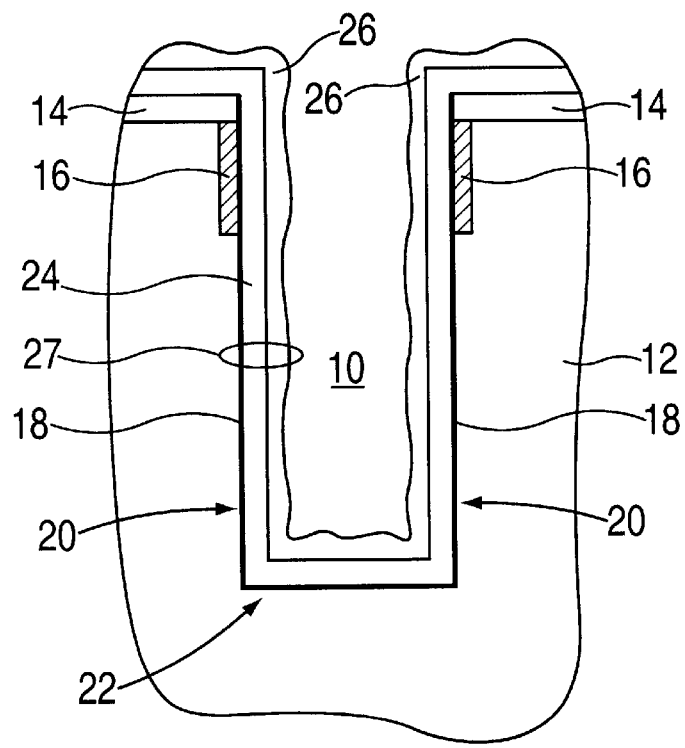

In FIG. 1(b), a thin base layer 18 is conformally formed on the sides 20 and bottom 22 surfaces of trench 10. The base layer 18 may include, for example, a nitride layer formed by the deposition of silicon nitride, or by nitridation of the silicon surface interface, resulting in roughly 10 angstroms (Å) of silicon nitride. The purpose of the base layer 18 is to provide good conditions for a subsequent layer of silicon formed thereupon.

Following the formation of base layer 18, a silicon layer 24 (e.g., polysilicon or amorphous silicon) is conformally deposited. Silicon layer 24 is formed in a non-uniform manner with regard to layer thickness, degree of crystallization, size, orientation of grains or domains, or any combination thereof. The average thickness of the silicon layer 24 may range from about 30 Å to about 150 Å, and, more specifically, may be about 100 Å. Then, a masking layer 26 is created upon the silicon layer 24. The masking layer 26 may be created by nitridation of the silicon. The masking layer 26 has a non-uniform thickness due to structural properties, such as the grain boundaries of the silicon layer 24, and may have a general, representative thickness of about 10 Å. Thus created, the masking layer 26 provides a starting non-uniform topography for a layered mask 27, comprising masking layer 26, silicon layer 24 and base layer 18. The starting non-uniform topography of masking layer 26 in layered mask 27 is then later enhanced and transferred into the trench silicon by subsequent etching.

Figure 1C:
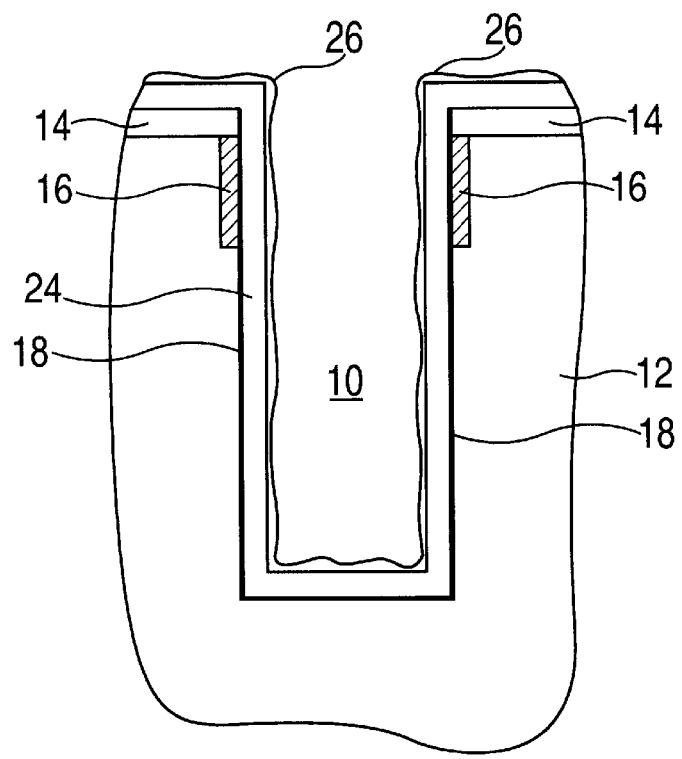

Referring now to FIG. 1(c), a surface roughening etch process is begun by applying an isotropic etch, which etches silicon significantly faster than the masking layer 26 (e.g, silicon nitride). The isotropic etch may be performed as either a dry etch or a wet etch. First, the isotropic etch begins to thin the non-uniform masking layer 26 in a homogeneous manner. Eventually, those portions of masking layer 26 that were initially the thinnest are completely etched away, exposing portions of the silicon layer 24 underneath. The remaining portions of masking layer 26 that were initially the thickest continue to be etched away at a homogeneous rate. At this point, the spatial thickness distribution of the remaining masking layer 26 corresponds to the spatial thickness distribution of the masking layer 26, as originally applied.

Figure 1D:
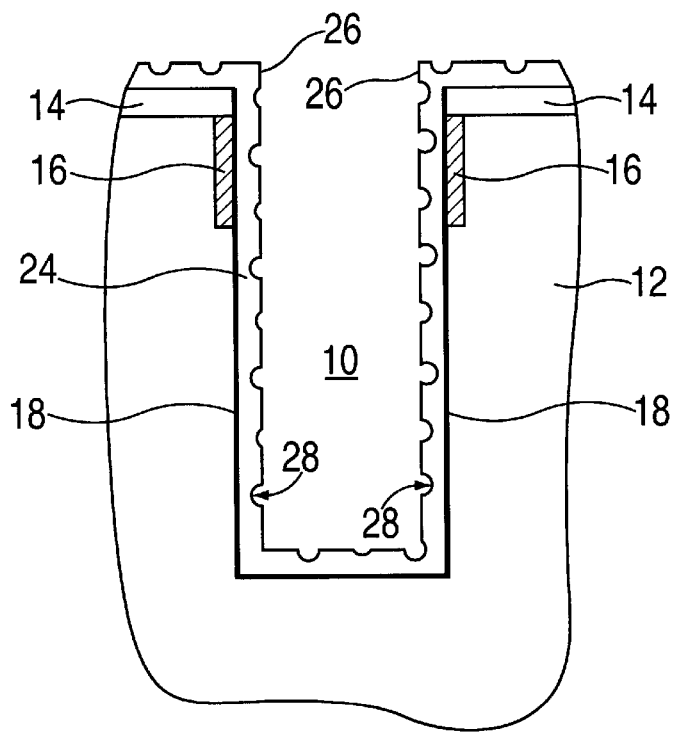

However, as shown in FIG. 1(d), once portions of the silicon layer 24 have been exposed, the etching process then starts to etch the silicon at a much faster rate than the remainder of the masking layer 26. As can be seen, the quicker etching of the silicon creates depressions 28 within the silicon layer 24, which depressions result in an amplification of the non-uniformity of the existing surface. Eventually, most, if not all, of the remaining portions of the masking layer 26 are be etched away. This is shown in FIG. 1(e).

By the time the remainder of masking layer 26 is substantially etched away, those portions of the silicon layer 24, initially exposed and then etched, are themselves nearly or entirely removed. Again, these areas correspond to the depressions 28 shown in FIG. 1(d). Once portions of the base layer 18 are exposed, the isotropic etch will begin to remove the same, but at a much slower rate than the silicon layer 24. At this point, the silicon layer 24 has substantially achieved a maximum surface roughness, as illustrated by the remaining bumps 30 of silicon material.

When portions of the base layer 18 have been exposed, the surface roughening etch process may be discontinued. An optical emission signal may be recorded and used to monitor the etch plasma, if the etch process used is a dry etch. By tracking a change in the optical emission signal, it can be determined when the masking layer 26 has been removed from the silicon surface or when the base layer 18 has been exposed and, at that point, the etching process is stopped.

Figure 1E:
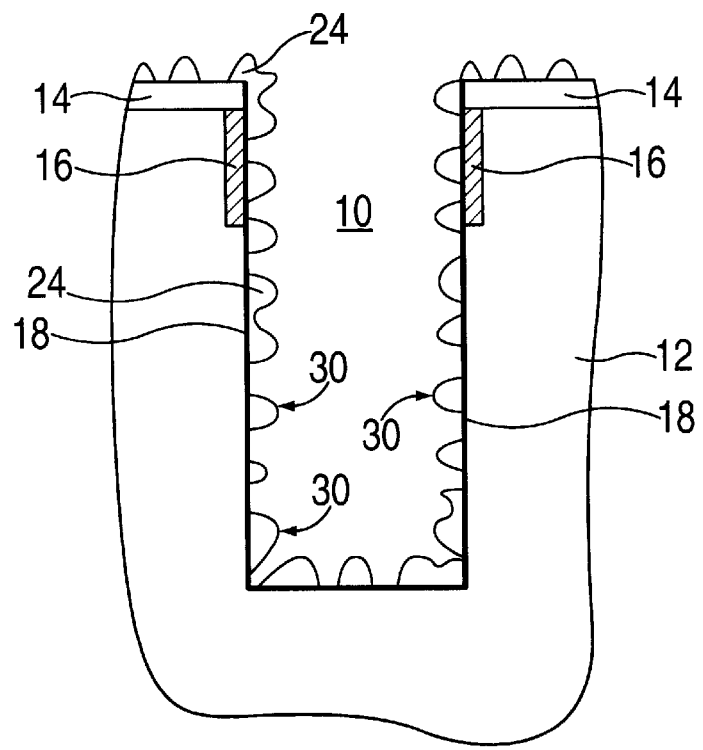
Figure 1F:
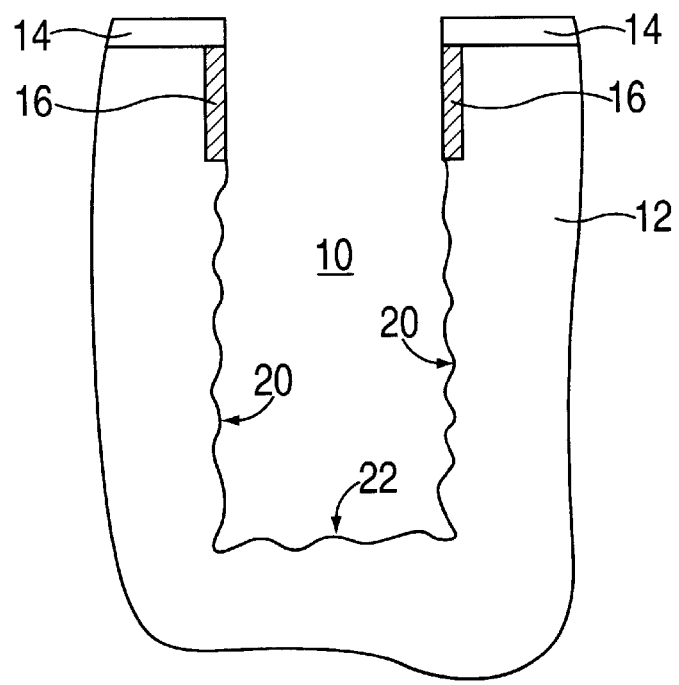

Finally, a transfer etch process is optionally applied, as shown in FIG. 1(e). In the transfer etch process, any remaining portions of the masking layer 26, the silicon layer 24, and the base layer 18 can subsequently be removed. The transfer etch process is also carried out as either a dry or a wet isotropic etch, in which all remaining layers of the layered mask 27 (the silicon layer 24 and, for example, nitride layers 18 and 26) are etched at about the same rate. As a result, the surface roughness (or non-uniformity) formed by the silicon bumps 30 in FIG. 1(e) is transferred into the crystal silicon material of the trench side and bottom surfaces 20, 22. This effect is illustrated in FIG. 1(f). In addition, the removal of the silicon and nitride residues helps to reduce the risk of device leakage.

It will be noted that the resulting surface roughness in the trench surfaces may not be quite as pronounced as the roughness of the silicon bumps 30. However, the final surface roughness is sufficient to increase the overall surface area of the trench surfaces and, accordingly, the capacitance value. Furthermore, this increase on overall surface area does not come at the cost of any significant increase in trench depth or diameter.

Figure 2A:
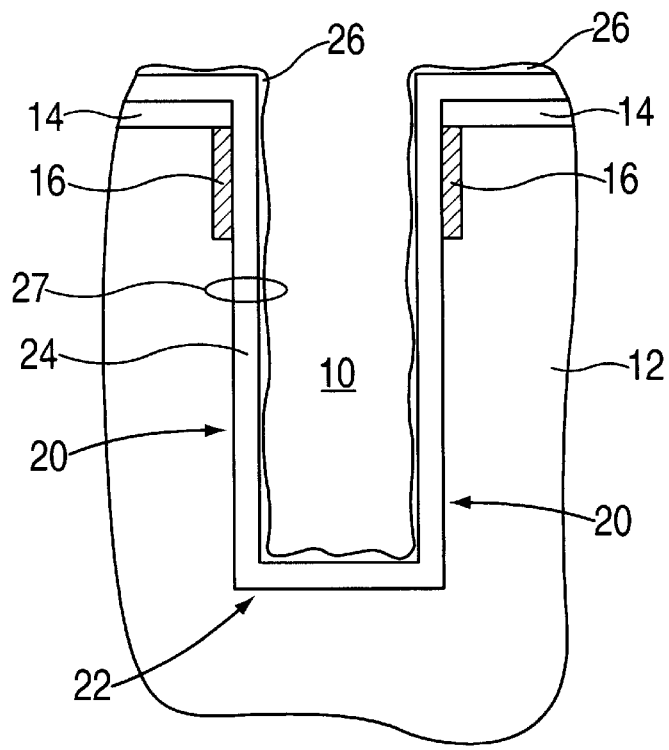
FIGS. 2(a)–2(d) are cross-sectional views which illustrate the processing steps of a method for increasing the surface area of a semiconductor device, in accordance with an alternative embodiment of the invention.
Figure 2B:
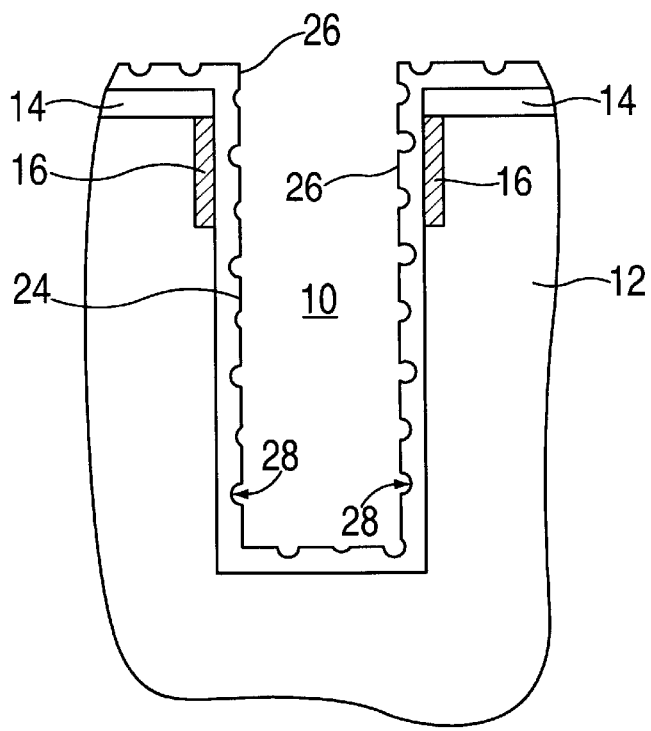

Referring now to FIGS. 2(a)–2(d), an alternative embodiment for increasing the surface area of an original surface of a semiconductor device is illustrated. In FIG. 2(a), the silicon layer 24 is conformally deposited upon the sides 20 and bottom 22 surfaces of trench 10, without a base layer thereunderneath. The silicon layer 24 in this embodiment includes a degree of non-uniformity (as also described in the earlier embodiment) so as to provide good conditions for a non-uniformity of a subsequently applied masking layer. An average thickness variation for the silicon layer may range from about 20 Å to about 100 Å and, more specifically, about 50 Å. Depending upon the particular deposition tools and processes used, additional measures may be taken to avoid epitaxial growth of the polysilicon on the crystalline silicon.

Following the formation of the silicon layer 24, a masking layer 26 is formed thereupon. Again, as in the previous embodiment, the masking layer 26 may be a nitride layer which is formed, for example, by nitridation of the silicon layer 24. It will be noted that in this embodiment, the layered mask 27 comprises only the silicon layer 24 and the masking layer 26, there being no base layer thereunderneath. The masking layer 26 has a general, non-uniform thickness of about 10 Å. Next, in FIG. 2(b), a surface roughening etch process is used to amplify the non-uniformity of the masking layer 26 into the silicon layer 24. As is the case for the previous embodiment, the roughening etch is an isotropic etch which etches silicon more quickly than a nitride layer. The thinnest portions of the masking layer 26 are etched away first, thereby exposing the silicon layer 24 and creating amplified depressions 28 therein.

Figure 2C:
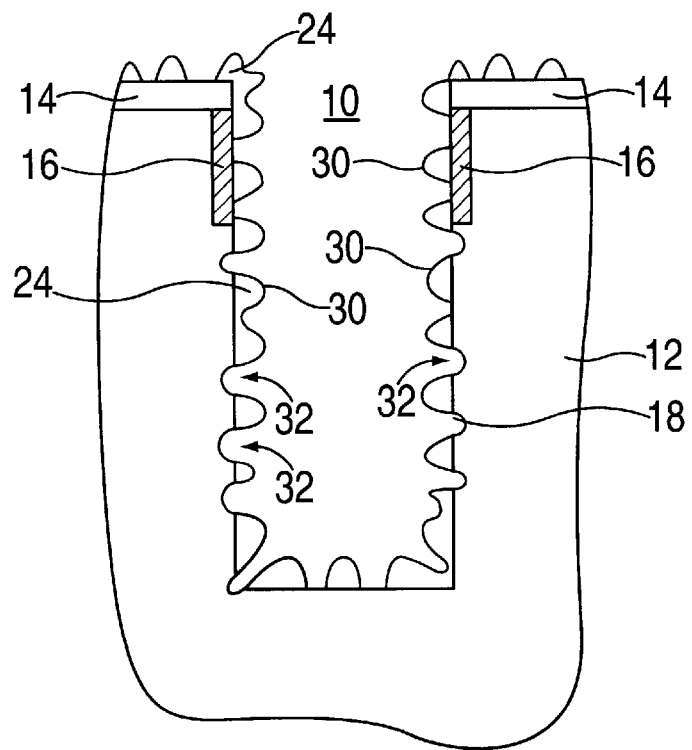

As etch time passes, most (if not all) of the masking layer 26 is removed and the roughening etch process continues through the silicon layer 24 and into the crystalline silicon surfaces 20, 22 of the trench 10. This is illustrated in FIG. 2(c). Because there is no base layer between the silicon layer 24 and the crystalline trench surface, the etching rate may remain substantially the same. As a result, depressions 32 are created in the crystalline silicon surfaces where the masking layer 26 was initially the thinnest (and where amplified depressions 28 in the silicon layer 24 were created), in addition to the remaining bumps 30 of polysilicon where the masking layer 26 was initially the thickest. Thus, as compared to FIG. 1(e), the etching process is not significantly slowed by a base layer 18, and the overall roughness can be amplified beyond the silicon layer 24 of the layered mask 27.

Figure 2D:
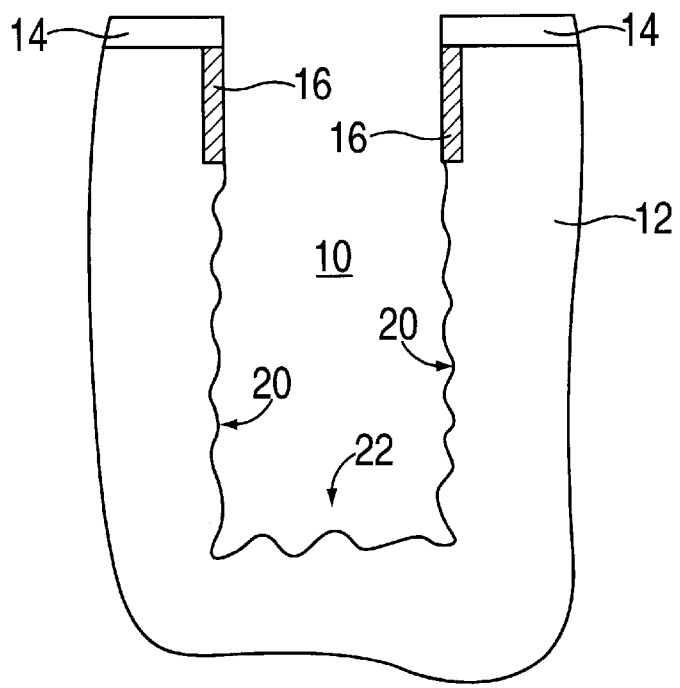

Finally, in FIG. 2(d), the roughness pattern created by the masking layer 26 and amplified by etching of the silicon layer may be partially or completely transferred into the crystalline trench surfaces. In the present embodiment, this may be carried out by a transfer etch as described earlier. Alternatively, the roughening etch may be continued until substantially all of the silicon and masking layers 24, 26 have been removed. Further, the silicon layer 24 in the second embodiment may be thinner than in the first embodiment, since it need only create appropriate conditions for the non-uniformity of the masking layer 26. In the first embodiment, the silicon layer 24 (being first deposited on base layer 18) also helps to define a maximum amplitude for the final non-uniformity of the trench surfaces.

In addition to the embodiments described hereinbefore, other process variations are contemplated. For example, the insulating collar 16, while widely used in DRAM technology, need not be present atop the trench 10 for the implantation of the above described method embodiments. As another example, the pad dielectric 14 need not be present atop the trench 10 for the implementation of the above described method embodiments. Because of the isotropic nature of the processing steps, specifically the roughening and transfer etches, the methods for increasing the surface area can be applied to all contemplated geometries. This includes, but is not limited to trenches of all aspect ratios (e.g., tapered trenches, bottle-shaped trenches, and the like) and elevated structures (e.g., pillar-shaped, crown shaped, and the like).

Also, an additional annealing step may be implemented to modify the structure of the silicon layer 24 such that the silicon grain size thereof is increased, thereby creating more favorable conditions for a non-uniform masking layer 26. The structure of the silicon layer 24 may also be modified by a wet etch step prior to the formation of the masking layer 26 to further enhance a non-uniform creation of the masking layer 26. Both or either of the silicon layer 24 and/or the underlying silicon 12 (e.g., trench wall) may also be doped at any process step where they are exposed to the possibility of doping (i.e., before they are covered by a deposition or are uncovered by an etch step such as by gas phase doping). Additional cleaning steps may also be performed before either deposition or an etch step.

Finally, other types of liner material (in lieu of a nitride layer) may be substituted for the masking layer 26 and the base layer 18. In the embodiments where the entire silicon layer 24 is removed, its material may also be substituted with a material such as amorphous germanium, for example. While the resulting etch chemistries may vary, depending upon the composition of the layers, the isotropic nature of the etch is the same.

Regardless of the specific embodiment(s) or processing steps implemented, the end result of the aforementioned disclosure is increased surface area. It is to be understood that neither the dominant lateral wavelength of the created roughness, nor the amplitude of a created surface wave, is solely responsible for a significant increase in surface area. They may lie in a wide range within the boundaries given by the geometry of the particular semiconductor device. Rather, it is the ratio of the amplitude to the wavelength of a surface wave which is enhanced for optimal results.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method for increasing the surface area of an original surface in a semiconductor device, the method comprising:
   forming a layered mask upon the original surface, said layered mask including a silicon layer upon the original surface and a nitride masking layer atop said silicon layer, said nitride masking layer having a varying thickness; and
   applying an isotropic etch to said layered mask, including both said silicon layer and said nitride masking layer;
   said isotropic etch further removing exposed portions of the original surface as said nitride masking layer and said silicon layer are removed, said silicon layer being etched at a faster rate than said nitride masking layer;
   wherein said isotropic etch creates a non-uniformity in planarity of the original surface.

2. The method of claim 1, wherein said nitride layer is formed by nitridation of said silicon layer.

3. The method of claim 1, wherein said isotropic etch is applied until said masking layer is completely removed.

4. The method of claim 3, wherein said isotropic etch is applied until both said masking layer and said silicon layer are completely removed.

5. The method of claim 1, wherein said masking layer is about 10 angstroms (Å) in thickness, prior to the etching thereof.

6. The method of claim 5, wherein said silicon layer is about 20 angstroms to about 100 angstroms in thickness, prior to the etching thereof.

7. The method of claim 1, wherein:
   said layered mask further includes a germanium layer; and
   said isotropic etch is applied until both said masking layer and said germanium layer are completely removed.

8. The method of claim 1, wherein the original surface includes a capacitor formed in the semiconductor device.

9. A method for increasing the surface area of an original surface in a semiconductor device, the method comprising:
   forming a base layer upon the original surface;
   forming a silicon layer upon said base layer;
   forming a masking layer upon said silicon layer, said masking layer having a varying thickness;
   said base layer, said silicon layer and said masking layer being included in a layered mask;
   applying a roughening etch, said roughening etch further comprising a first isotropic etch which etches said silicon layer at a faster rate than said masking layer;
   said roughening etch further amplifying a non-uniformity in the planarity of said masking layer into said silicon layer; and
   applying a transfer etch, said transfer etch further comprising a second isotropic etch which etches said masking layer, said silicon layer and said base layer at about the same rate;
   wherein said transfer etch transfers said non-uniformity in the planarity of said silicon layer into a non-uniformity of the planarity of the original surface by removing exposed portions of the original surface as said base layer is removed.

10. The method of claim 9, wherein said masking layer further comprises a nitride layer.

11. The method of claim 9, wherein said base layer comprises another nitride layer.

12. The method of claim 11, wherein said masking layer is formed by nitridation of said silicon layer.

13. The method of claim 9, wherein said roughening etch is applied until said masking layer is removed.

14. The method of claim 13, wherein said transfer etch is applied until said masking layer, said silicon layer and said base layer are completely removed.

15. The method of claim 9, wherein said masking layer is about 10 angstroms (Å) in thickness, prior to the etching thereof.

16. The method of claim 15, wherein said silicon layer is about 30 angstroms to about 150 angstroms in thickness, prior to the etching thereof.

17. The method of claim 9, wherein said base layer is about 10 angstroms in thickness, prior to the etching thereof.

18. The method of claim 9, wherein the original surface includes a capacitor formed in the semiconductor device.

* * * * *